(12) United States Patent
Wu et al.

(10) Patent No.: US 9,258,924 B2
(45) Date of Patent: Feb. 9, 2016

(54) HEAT DISSIPATION DEVICE FOR ELECTRONIC BALLAST

(71) Applicant: Shenzhen Longood Intelligent Electric Co., Ltd, Shenzhen, Guangdon (CN)

(72) Inventors: Wei Wu, Bengbu (CN); Jianlin Huang, Guangdong (CN); Qingsong Chu, Hunan (CN)

(73) Assignee: SHENZHEN LONGOOD INTELLIGENT ELECTRIC CO., LTD., Shenzhen (CN)

( * ) Notice: Subject to any disclaimer, the term of this patent is extended or adjusted under 35 U.S.C. 154(b) by 273 days.

(21) Appl. No.: 14/019,564

(22) Filed: Sep. 6, 2013

(65) Prior Publication Data

US 2015/0049436 A1   Feb. 19, 2015

(30) Foreign Application Priority Data

Aug. 13, 2013   (CN) ...................... 2013 2 0493618 U

(51) Int. Cl.
*H05K 7/20* (2006.01)
*H01L 23/473* (2006.01)

(52) U.S. Cl.
CPC .................................. *H05K 7/20163* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ....................... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 6,091,199 A * | 7/2000 | Van Pelt | ................ | H01L 23/367 257/E23.09 |
| 7,750,252 B2 * | 7/2010 | Colby | ..................... | H01L 23/34 165/80.3 |
| 8,493,762 B2 * | 7/2013 | Ninomiya | ............. | H01L 25/112 361/715 |
| 8,687,357 B2 * | 4/2014 | Nagano | .................... | H05K 7/20 165/104.33 |
| 2004/0109293 A1 * | 6/2004 | Apfelbacher | ........ | H01H 50/021 361/709 |
| 2004/0218375 A1 * | 11/2004 | Fronk | .................... | H05K 7/209 361/813 |
| 2005/0135065 A1 * | 6/2005 | Nakatsu | ............. | H01L 23/4006 361/703 |
| 2005/0286226 A1 * | 12/2005 | Ishii | ...................... | H01L 23/467 361/697 |
| 2006/0018100 A1 * | 1/2006 | Guo | ........................ | H01L 24/49 361/719 |
| 2006/0232942 A1 * | 10/2006 | Nakatsu | ................. | B60L 11/08 361/710 |
| 2007/0025087 A1 * | 2/2007 | Chen | ..................... | H05K 7/209 361/704 |

(Continued)

*Primary Examiner* — Anthony Haughton
*Assistant Examiner* — Razmeen Gafur

(57) ABSTRACT

An electronic ballast is provided with an elongated housing; a heat sink module disposed in the housing and including a channel extending from one end to an other end; a plurality of power semiconductor modules disposed on both sides of the heat sink module respectively; an inlet assembly disposed at one end of the heat sink module proximate to a first panel at one end of the housing; an outlet assembly disposed at the other end of the heat sink module proximate to a second panel at an other end of the housing; and a fan disposed between the other end of the heat sink module and the second panel. Only a small portion of heat is dissipated by surface areas of the housing. Thus, the housing can be made compact to save space.

2 Claims, 1 Drawing Sheet

(56) References Cited

U.S. PATENT DOCUMENTS

| | | | | |
|---|---|---|---|---|
| 2007/0070584 A1* | 3/2007 | Quazi | F21V 23/026 | 361/641 |
| 2007/0236883 A1* | 10/2007 | Ruiz | H01L 23/473 | 361/699 |
| 2008/0144279 A1* | 6/2008 | Yamamoto | H05K 7/20918 | 361/694 |
| 2008/0192437 A1* | 8/2008 | Furuta | H01C 3/06 | 361/715 |
| 2008/0225487 A1* | 9/2008 | Nakajima | H05K 7/20927 | 361/699 |
| 2009/0000768 A1* | 1/2009 | Zheng | F28D 15/0275 | 165/80.3 |
| 2009/0073659 A1* | 3/2009 | Peng | H05K 7/209 | 361/709 |
| 2009/0244845 A1* | 10/2009 | Nagamoto | H05K 7/20918 | 361/697 |
| 2010/0079940 A1* | 4/2010 | Mongia | G06F 1/203 | 361/679.49 |
| 2010/0124016 A1* | 5/2010 | Gu | G06F 1/1626 | 361/694 |
| 2011/0058330 A1* | 3/2011 | Abraham | G06F 1/20 | 361/679.47 |
| 2011/0182028 A1* | 7/2011 | Tan | H05K 7/20727 | 361/679.46 |
| 2011/0216507 A1* | 9/2011 | Kadomoto | H05K 7/20 | 361/714 |
| 2011/0292611 A1* | 12/2011 | Higuchi | H01L 23/3675 | 361/717 |

\* cited by examiner

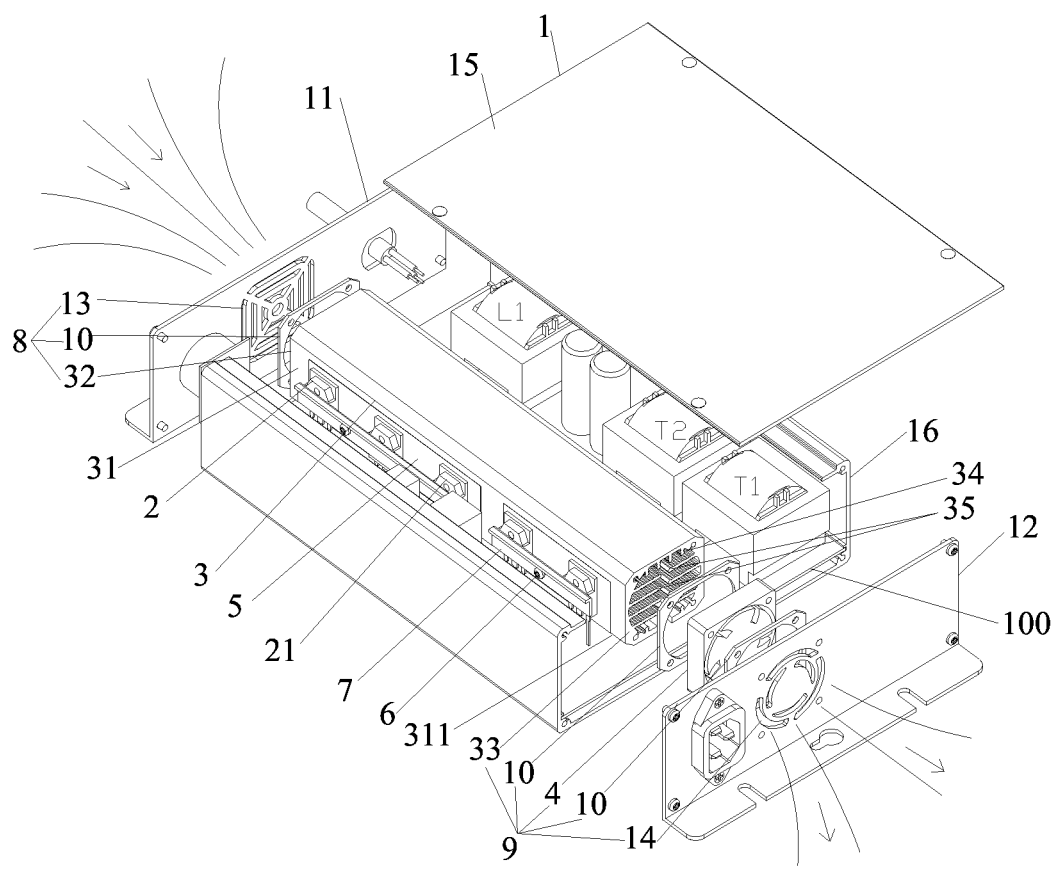

HEAT DISSIPATION DEVICE FOR ELECTRONIC BALLAST

BACKGROUND OF THE INVENTION

1. Field of the Invention

The invention relates to electronic ballasts and more particularly to an electronic ballast having a heat dissipation device with improved characteristics.

2. Description of Related Art

Two conventional types of heat dissipation device for electronic ballast are available and discussed below.

One conventional heat dissipation device for electronic ballast is based on natural convection. Heat removal capability of the heat dissipation device is proportional to surface area contacting air. Thus, a large housing having an increase surface area is implemented in the electronic ballast. However, such electronic ballasts are disadvantageous due to inconvenience in use, bulkiness, high manufacturing cost, and high shipping cost.

The other conventional heat dissipation device for electronic ballast is implemented by installing a fan for removing excessive heat out of the electronic ballast (i.e., forced convection). Therefore, the electronic ballasts can be compact. However, dust, moisture, and other foreign objects may be brought into the electronic ballast to damage internal components by the operating fan. This is not safe.

Thus, the need for improvement still exists.

SUMMARY OF THE INVENTION

It is therefore one object of the invention to provide an electronic ballast comprising an elongated housing; a heat sink module disposed in the housing and including a channel extending from one end to an other end; a plurality of power semiconductor modules disposed on both sides of the heat sink module respectively; an inlet assembly disposed at one end of the heat sink module proximate to a first panel at one end of the housing; an outlet assembly disposed at the other end of the heat sink module proximate to a second panel at an other end of the housing; and a fan disposed between the other end of the heat sink module and the second panel. Only a small portion of heat is dissipated by surface areas of the housing.

In a first aspect of the invention there is a printed circuit board (PCB) disposed on an inner surface of the heat sink module.

In a second aspect of the invention the first panel includes a plurality of first openings in close proximity to one end of the channel for communicating therewith; the second panel includes a plurality of second openings; and an other end of the channel, the fan, and the second openings are aligned for communication.

In a third aspect of the invention there are a first gasket disposed to fill a space between the first openings and one end of the heat sink module, a second gasket disposed to fill a space between the second openings and the fan, and a third gasket disposed to fill a space between the fan and the other end of the heat sink module.

In a fourth aspect of the invention there are a plurality of spaced fins disposed in the heat sink module, the number of the fins being greater than 10.

In a fifth aspect of the invention there are two insulating silicon members each disposed between either side of the heat sink module and the power semiconductor modules.

In a sixth aspect of the invention the power semiconductor module includes at least one of a bridge stack and a metal-oxide-semiconductor (MOS).

In a seventh aspect of the invention there are a plurality of mounting plates secured to the power semiconductor modules by a plurality of fasteners driven through the mounting plates into the sides of the heat sink module.

By utilizing the invention, the housing can be made compact to save space because only a small portion of heat is dissipated by surface areas of the housing.

The above and other objects, features and advantages of the invention will become apparent from the following detailed description taken with the accompanying drawings.

BRIEF DESCRIPTION OF THE DRAWINGS

FIG. 1 is an exploded perspective view of an electronic ballast incorporating a heat dissipation device according to the invention.

DETAILED DESCRIPTION OF THE INVENTION

Referring to FIG. 1, an electronic ballast in accordance with the invention comprises the following components as discussed in detail below.

An elongated housing 1, a plurality of power semiconductor modules 2, and a heat sink module 3 are provided. The heat sink module 3 is disposed in the housing 1. The power semiconductor modules 2 are disposed on both sides 31 of the heat sink module 3. An inlet assembly 8 is disposed at one end 32 of the heat sink module 3 proximate to a first panel 11 at one end of the housing 1. There are a plurality of elongated first openings 13 formed on the first panel 11. The first openings 13 are in close proximity to one end 32 of the heat sink module 3 and are adapted to communicate therewith. Further, a gasket (e.g., o-ring or the like) 10 is disposed to fill a space between the first openings 13 and one end 32 of the heat sink module 3 for leakage prevention.

An outlet assembly 9 is disposed at the other end 33 of the heat sink module 3 proximate to a second panel 12 at the other end of the housing 1. There are a plurality of curved second openings 14 formed on the second panel 12. The second openings 14 are in close proximity to the other end 33 of the heat sink module 3 and are adapted to communicate therewith. Further, a fan 4 is provided between the other end 33 of the heat sink module 3 and the second panel 12, and two gaskets (e.g., o-rings or the like) 10 are provided in which one gasket 10 is disposed to fill a space between the second openings 14 and the fan 4 and the other gasket 10 is disposed to fill a space between the fan 4 and the other end 33 of the heat sink module 3 for leakage prevention.

A channel 34 is provided through the heat sink module 3 and has one end communicating with the inlet assembly 8 and the other end communicating with the outlet assembly 9. A plurality of spaced fins 35 are disposed in the channel 34 for heat dissipation. Preferably, the number of the fins is greater than 10. A printed circuit board (PCB) 100 is disposed under a bottom 311 of the heat sink module 3. Heat generated by the PCB 100 is dissipated by heat sink module 3. The housing 1 comprises the first panel 11, the second panel 12, a top cover 15, and a support 16 shaped as a U when viewing from either end.

Two insulating silicon members 5 each are provided between either side 31 of the heat sink module 3 and the power semiconductor modules 2. The silicon members 5 have a high thermal conductivity. The power semiconductor module 2 includes a bridge stack and a metal-oxide-semiconductor (MOS) 21. A plurality of mounting plates 7 are secured to the power semiconductor modules 2 by a plurality of fasteners 6 (e.g., screws) driven through the mounting plates 7 into the sides 31 of the heat sink module 3.

Cooling operation of the electronic ballast is described in detail below. Regarding the electronic ballast, a lot of heat is generated by the power semiconductor modules 2. The heat is transferred to the sides 31 by thermal conduction. The fan 4 activates to draw fresh air into both the housing 1 and the heat sink module 3 via the inlet assembly 8 (i.e., forced convection). The drawn air can carry a substantial portion of excessive heat generated by the power semiconductor modules 2 through the exposed fins in the channel 34 to the outlet assembly 9. Finally, heat is carried out of the housing 1.

A small portion of power (or energy) of the electronic ballast is consumed by a plurality of transformers L1, T1, and T2. The consumed energy in the form of heat is transferred to the surface of the housing 1 by thermal conduction. Further, the heat is carried out of the housing 1 by natural convection. The rate of heat transfer can be expressed in the following equation: $W = hA\Delta t$ where h is the heat transfer coefficient, A is the surface area of the heat being transferred, and $\Delta t$ is the time-dependent thermal gradient between environment and object (i.e., the surfaces of the housing 1). Only a small portion of heat is dissipated by the surface areas of the housing 1. Thus, the housing 1 can be made compact to save space.

While the invention has been described in terms of preferred embodiments, those skilled in the art will recognize that the invention can be practiced with modifications within the spirit and scope of the appended claims.

What is claimed is:

1. An electronic ballast comprising:
an elongated housing;
a heat sink module disposed in the housing and including a channel extending from one end to an other end;
a plurality of power semiconductor modules disposed on both sides of the heat sink module respectively;
an inlet assembly disposed at one end of the heat sink module proximate to a first panel at one end of the housing;
an outlet assembly disposed at the other end of the heat sink module proximate to a second panel at an other end of the housing;
a fan disposed between the other end of the heat sink module and the second panel;
wherein the first panel includes a plurality of first openings in close proximity to one end of the channel for communicating therewith; the second panel includes a plurality of second openings; and an other end of the channel, the fan, and the second openings are aligned for communication;
a first gasket disposed to fill a space between the first openings and one end of the heat sink module;
a second gasket disposed to fill a space between the second openings and the fan; and
a third gasket disposed to fill a space between the fan and the other end of the heat sink module.

2. An electronic ballast comprising:
an elongated housing;
a heat sink module disposed in the housing and including a channel extending from one end to an other end;
a plurality of power semiconductor modules disposed on both sides of the heat sink module respectively;
an inlet assembly disposed at one end of the heat sink module proximate to a first panel at one end of the housing;
an outlet assembly disposed at the other end of the heat sink module proximate to a second panel at an other end of the housing;
a fan disposed between the other end of the heat sink module and the second panel;
a printed circuit board (PCB) disposed under the heat sink module;
wherein the first panel includes a plurality of first openings in close proximity to one end of the channel for communicating therewith; the second panel includes a plurality of second openings; and an other end of the channel, the fan, and the second openings are aligned for communication;
a first gasket disposed to fill a space between the first openings and one end of the heat sink module;
a second gasket disposed to fill a space between the second openings and the fan; and
a third gasket disposed to fill a space between the fan and the other end of the heat sink module.

* * * * *